United States Patent [19]

Saito

[11] Patent Number: 5,351,210
[45] Date of Patent: Sep. 27, 1994

[54] SERIALLY ACCESSIBLE SEMICONDUCTOR MEMORY WITH MULTIPLE LEVEL STORAGE CELLS

[75] Inventor: Shozo Saito, Yokohama, Japan

[73] Assignee: Kabushiki Kaisha Toshiba, Kawasaki, Japan

[21] Appl. No.: 799,296

[22] Filed: Nov. 27, 1991

[30] Foreign Application Priority Data

Nov. 28, 1990 [JP] Japan .................. 2-328463

[51] Int. Cl.$^5$ .......................... G11C 7/00; G11C 7/02
[52] U.S. Cl. .......................... 365/189.01; 365/189.12; 365/210; 365/221
[58] Field of Search ...................... 365/189.09, 189.12, 365/203, 200, 145, 189.01, 210, 221

[56] References Cited

U.S. PATENT DOCUMENTS

| | | | |
|---|---|---|---|
| 4,661,929 | 4/1987 | Aoki et al. | 365/149 |
| 4,701,884 | 10/1987 | Aoki et al. | 365/189.09 |
| 4,819,213 | 4/1989 | Yamaguchi et al. | 365/219 |
| 4,841,483 | 6/1989 | Furuyama | 365/189.07 |
| 4,888,630 | 12/1989 | Paterson | 365/145 |
| 4,890,259 | 12/1989 | Simko | 365/185 |
| 5,117,392 | 5/1992 | Harada | 365/203 |
| 5,172,339 | 12/1992 | Noguchi et al. | 365/200 |

OTHER PUBLICATIONS

An Experimental 2-bit/Cell Storage DRAM for Macrocell or Memory-on-Logic Application, Tohru Furuyama et al., IEEE Journal of Solid State Circuits, vol. 24, No. 2, pp. 388-398, Apr. (1989).

A 16-Levels/Cell Dynamic Memory, Masakazu Aoki et al., IEEE International Solid-State Circuits Conference, pp. 246-247, Feb. 15, 1985.

Primary Examiner—Eugene R. LaRoche
Assistant Examiner—Son Dinh
Attorney, Agent, or Firm—Finnegan, Henderson, Farabow, Garrett & Dunner

[57] ABSTRACT

According to this invention, in a data bit array for storing data, a plurality of memory cells capable of storing 4-level data are arranged in column and row directions. A check bit array for storing check data has a number of bits smaller than that of the data bit array. In the check bit array, a plurality of memory cells capable of storing 4-level data are arranged in column and row directions. A row address decoder selects one row from the check bit array and the data bit array in accordance with address data. Three sense amplifiers are connected to one column of the check bit array and the data bit array. The three sense amplifiers detect levels of data read from a memory cell in accordance with different reference levels in data read access, receive a plurality of precharge levels corresponding to 4-level write data, and write one of the precharged levels in the corresponding memory cell in accordance with write data. A data converter converts levels of data detected by the sense amplifiers into 2-bit data in data read access and selects a sense amplifier in accordance with write data having a plurality of bits in data write access. An input/output circuit serially outputs data supplied from the data converter in data read access and supplies external write data to the data converter in data write access.

22 Claims, 7 Drawing Sheets

| CELL LEVEL | B1 | B2 | RD1 | RD2 | RD3 |
|---|---|---|---|---|---|
| VCC | 1 | 1 | 1 | 1 | 1 |
| 2/3 VCC | 1 | 0 | 0 | 1 | 1 |
| 1/3 VCC | 0 | 1 | 0 | 0 | 1 |
| VSS | 0 | 0 | 0 | 0 | 0 |

| CELL LEVEL | B1 | B2 | RW1 | RW2 | RW3 |
|---|---|---|---|---|---|
| VCC | 1 | 1 | 1 | 0 | 0 |
| 2/3 VCC | 1 | 0 | 0 | 1 | 0 |
| 1/3 VCC | 0 | 1 | 0 | 0 | 1 |
| VSS | 0 | 0 | 0 | 0 | 0 |

SERIALLY ACCESSIBLE SEMICONDUCTOR MEMORY WITH MULTIPLE LEVEL STORAGE CELLS

BACKGROUND OF THE INVENTION

1. Field of the Invention

The present invention relates to an improvement of a semiconductor memory having a memory cell array capable of storing multi-level data having two or more bits in, e.g., one memory cell.

2. Description of the Related Art

In recent years, semiconductor memory technology has rapidly progressed, and storage capacity has been steadily increased at a rate of four times in three years. According to this, cost per bit is continuously decreased, to the point where the cost is lower than a magnetic disk device. In addition, since a semiconductor memory has no mechanically operated portion, the access speed of the memory device is higher than that of a magnetic disk device. Therefore, semiconductor memory is expected to update the hierarchy of memory devices. However, since a low-cost compact magnetic disk device has been developed, the cost per bit of a semiconductor memory is hard to make lower than that of a magnetic disk device yet.

In a semiconductor memory, it is difficult to rapidly decrease the cost per bit by an increase in storage capacity using micropatterning. Since a conventional memory cell can store only 1-bit data, an amount of data stored in a silicon chip is necessarily limited, and even a memory which has a maximum large capacity at present is a 16-Mbit memory.

When a semiconductor memory is used in place of a magnetic disk device, the function of a conventionally used random access memory (RAM) is not required, only a simple serial-access function is sufficient. In an operating system or application software intended for an existing magnetic disk device, 256 bits are regarded as one sector. Therefore, a function of serially outputting an amount of data corresponding to one sector is required for a semiconductor memory.

In a magnetic disk device, the following method of correcting bit errors is used. In this method, 20 to 30 check (redundancy) bits are added to one sector, and bit errors are corrected by an error detection/correction circuit. As an error correction code, the well-known BCH code or Reed-Solomon code is applied. For example, by using the Reed-Solomon code, when 48 check bits are added to 512 data bits, 5 bits can be detected, and 3 bits can be corrected. As other error correction methods, a byte error detection/correction method and a burst error detection/correction method are used.

When a semiconductor memory is used in place of a magnetic disk device, the above error detection/correction circuit must be accommodated in a chip, or an external circuit including the error detection/correction circuit must be arranged independently of the chip. In the former case, in addition to data bits, check bits must be arranged in the chip.

As described above, in order to obtain a low-cost semiconductor memory in which a maximum amount of data is stored in one chip, a multi-level storage method for storing data having two or more bits in one cell must be used. This multi-level storage method is described in, e.g., "An Experimental 2-bit/Cell Storage DRAM for Macrocell or Memory-on-Logic Application" IEEE Journal of Solid-State Circuits, Vol. 24, No. 2, April 1989, or "A 16-Level/Cell Dynamic Memory" 1985 IEEE Journal of Solid-State Circuits Conference p. 246,247.

However, in both the above multi-level storage methods, a control operation for a potential of a bit line or a word line is complicated. In addition, a data converter for converting multi-level data read from a memory cell into multi-bit data or converting multi-bit data into multi-level data to be written in a memory cell is required. This data converter has a complicated structure. When this data converter is used, it is difficult to access a plurality of memory cells at the same time. Therefore, a large amount of data cannot be easily accessed at a high speed.

SUMMARY OF THE INVENTION

It is an object of the present invention to provide a semiconductor memory capable of storing a large amount of data by storing data having two or more bits in one memory cell, easily controlling potentials of a bit line and the like, obtaining a simple data converter, and performing serial access at a high speed.

In order to achieve the above object of the present invention, there is provided a semiconductor memory comprising:

a memory cell array having a plurality of memory cells, each of the plurality of memory cells storing multi-level data having not less than two bits;

an amplifier connected to the memory cell array, the amplifier detecting multi-level data read from the memory cell in data read access on the basis of a plurality of reference levels so as to write data in the memory cell in accordance with a precharge level corresponding to write data having a plurality of bits in data write access;

a data converter connected to the amplifier, the data converter converting multi-level data output from the amplifier into data having a plurality of bits in data read access so as to select the amplifier in accordance with write data having a plurality of bits in data write access; and an input/output circuit connected to the data converter, the input/output circuit serially outputting data supplied from the data converter in data read access so as to supply external write data to the data converter in data write access.

According to the present invention, since data having two or more bits can be stored in one memory cell, a cost per bit can be decreased. In addition, a large amount of data can be serially accessed.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will be described below with reference to the accompanying drawing.

Figures 3, 4A, 4B:
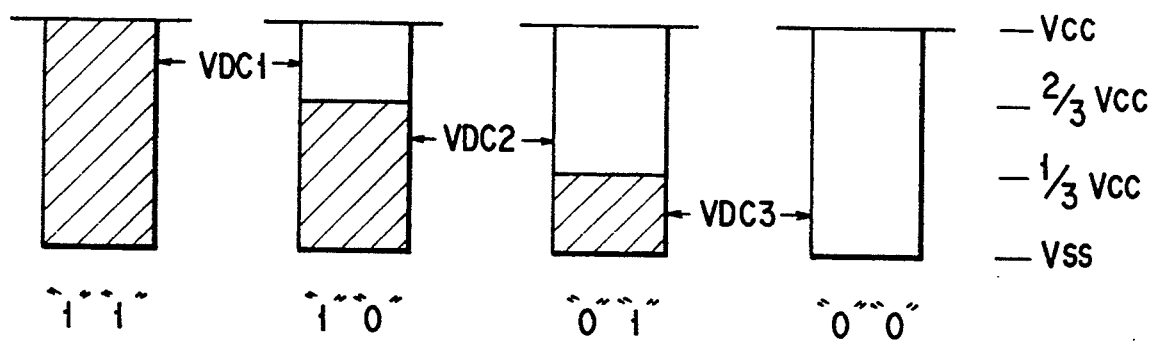
FIG. 3 is a view for explaining a memory cell according to the present invention.
FIGS. 4A and 4B are data conversion tables applied to a data converter.

FIG. 3 shows the concept of a memory cell for storing multi-level data according to the present invention. That is, FIG. 3 shows the potential well of a capacitor of a dynamic memory cell. In a conventional technique, a state of a fully charged potential well is set as "1" level, and a state of a non-charged or empty potential well is set as "0" level, such that these levels are stored as one bit.

In contrast to this, in this embodiment, as shown in FIG. 3, multi-level, e.g., 4-level, data are stored in one potential well. In this case, an amount of charge stored in the potential well is divided into four states. That is, a state of a full charge amount is defined as "1" "1", a state of a ⅔ charge amount is defined as "1" "0", a ⅓ charge amount is defined as "0" "1", and a 0 charge amount is defined as "0" "0". These four charge amounts are discriminated using three reference levels (VDCA, VDCB, and VDCC).

FIG. 3 shows a case wherein four-level data is stored in one memory cell. However, since the three or more reference levels are used, data having four or more levels can be stored in one memory cell.

Figure 1:
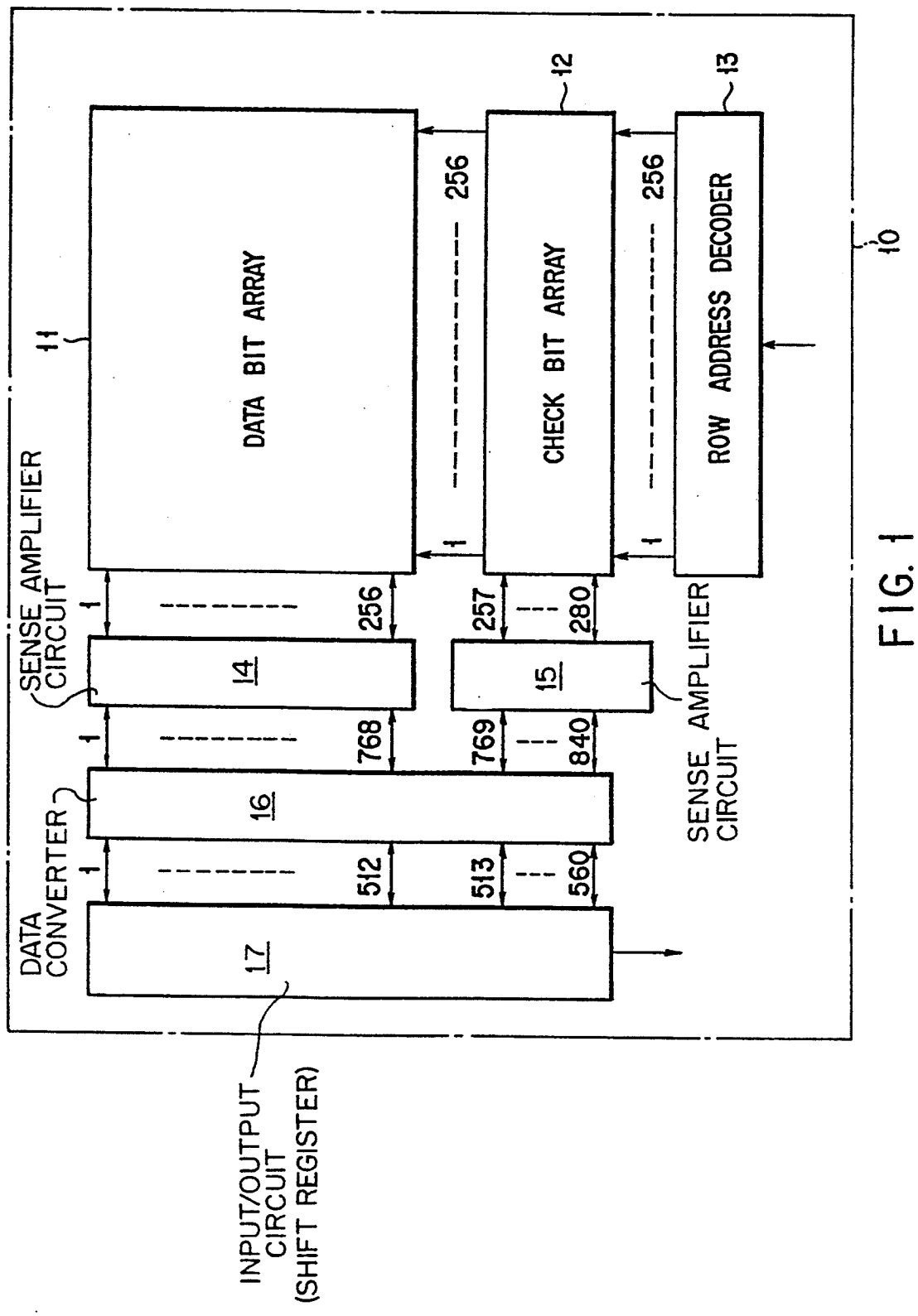
FIG. 1 is a circuit diagram showing a memory cell according to an embodiment of the present invention.

FIG. 1 shows an arrangement of a serial access memory using a cell capable of storing multi-level data. This serial access memory is constituted by, e.g., one chip. That is, a data bit array 11, a check bit array 12, a row address decoder 13, sense amplifier circuits 14 and 15, a data converter 16, and an input/output circuit 17 are arranged on a semiconductor substrate 10.

The bit array 11 is used for storing data and constituted by 256×256 memory cells arranged in column and row directions. Each of these memory cells can store 2-bit (=4-level) data, as described above. Therefore, the data bit array 11 can store data having 512×256 bits. The check bit array 12 is connected to the data bit array 11.

The check bit array 12 is used for storing check bits for error correction and constituted by 24×256 memory cells arranged in column and row directions. These memory cells employ a cell system capable of storing 2-bit data in one memory cell, as in the above data bit array 11. For this reason, the check bit array 12 can store data having 48×256 bits. The row address decoder 13 is connected to the check bit array 12. The row address decoder 13 selects one of 256 word lines. That is, one word line commonly used for the data bit array 11 and the check bit array 12 is selected.

The sense amplifier circuits (S/A) 14 and 15 are connected to the data bit array 11 and the check bit array 12, respectively. Each of these sense amplifier circuits 14 and 15 is constituted by a plurality of sense amplifiers having three reference levels to be described later. These sense amplifier circuits 14 and 15 detect data read from any one of 280 bit lines in accordance with the reference levels to write 1-level data of 4-level data in a bit line. The data converter 16 is connected to the sense amplifier circuits 14 and 15.

This data converter 16 converts data read from the sense amplifier circuits 14 and 15 into 2-bit data, or converts 2-bit input data into 4-level data, and selects a sense amplifier circuit which is operated to write 4-level data. The data converter 16 is connected to the input/output circuit 17.

The input/output circuit 17 is constituted by, e.g., a shift resistor. The input/output circuit 17 latches 560-bit data read from the data converter 16 in a shift resister to output it as 560-bit serial data in accordance with an external clock signal, or the input/output circuit 17 latches external 560-bit serial data to supply the latched data to the data converter 16. As the input/output circuit 17, a shift resister using a method of transferring data by a clock signal or a shift resister using an address pointer method can be applied.

Figure 2A:
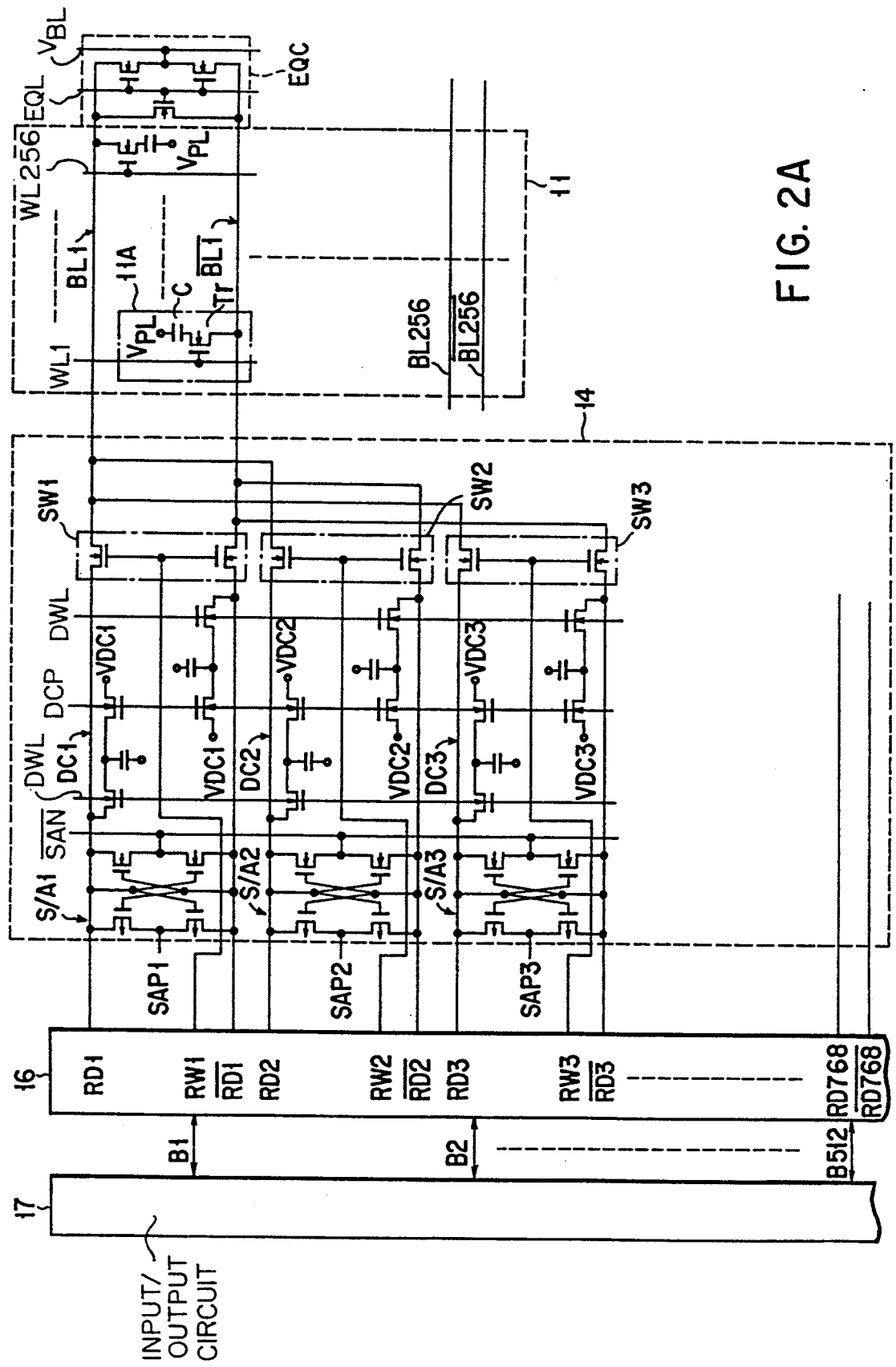
FIGS. 2A and 2B are circuit diagrams showing the memory cell of FIG. 1 in detail.
Figure 2B:
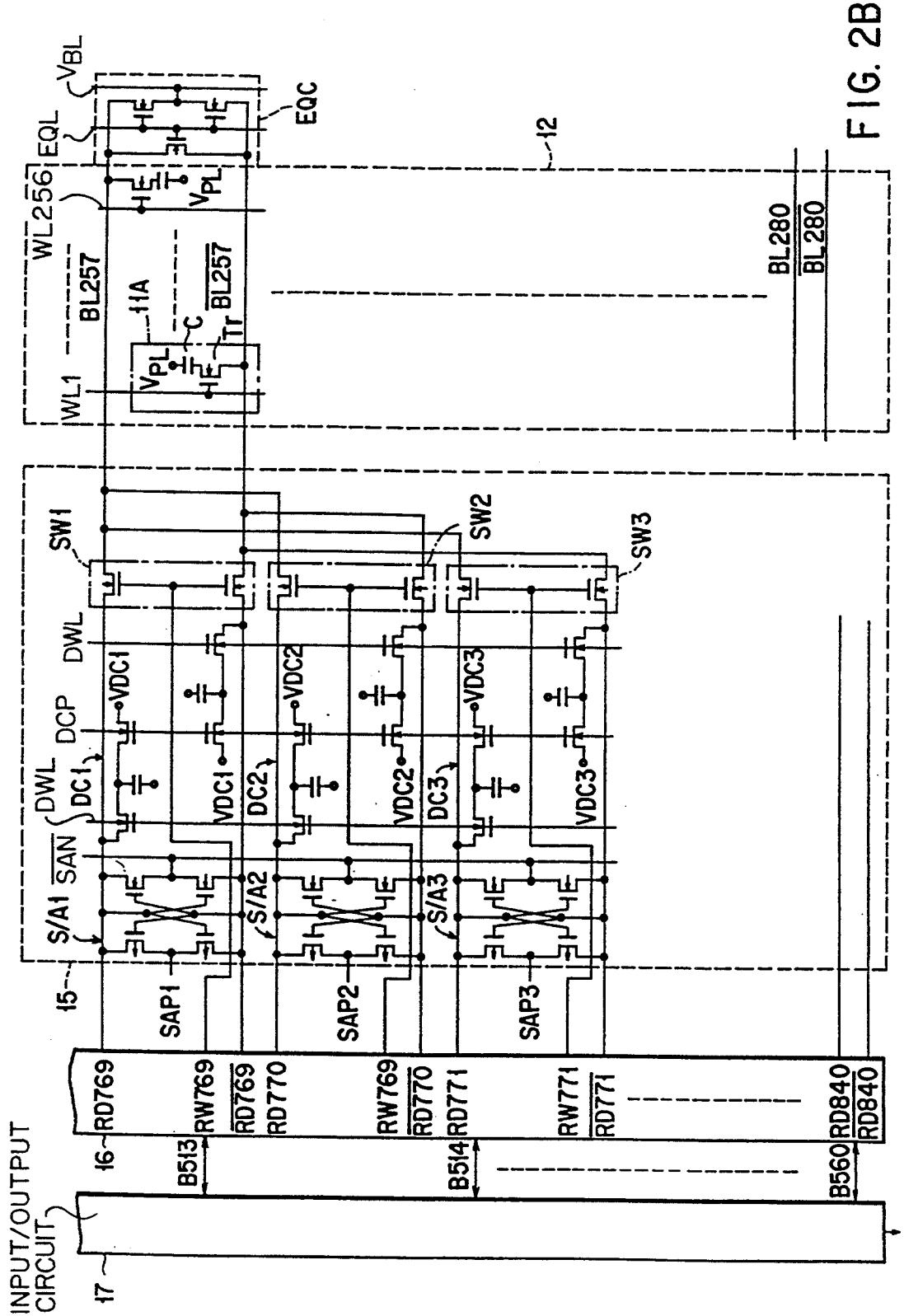

FIGS. 2A and 2B show the serial access memory of FIG. 1 in detail, and the same reference numeral as in FIG. 1 denote the same parts as FIGS. 2A and 2B. In FIGS. 2A and 2B, the data bit array 11 and the check bit array 12 have the same arrangement, and the sense amplifier circuits 14 and 15 have the same arrangement. Therefore, the data bit array 11 and the sense amplifier circuit 14 will be described below in detail.

256 memory cells 11A are connected to bit lines BL1, $\overline{BL1}$ to BL256, $\overline{BL256}$, and the memory cells 11A are electrically connected to the bit lines through 256 word lines WL1 to WL256. Each of the memory cells 11A is constituted by, e.g., one transistor Tr and one capacitor C. An equalizing circuit EQC is arranged to a pair of bit lines. This equalizing circuit EQC equalizes the bit lines in accordance with a bit line equalizing signal EQL.

Three sense amplifiers S/A1, S/A2, and S/A3 are connected to a pair of bit lines through switching circuits SW1, SW2, and SW3, and dummy cells DC1, DC2, and DC3 in which different reference levels VDC1, VDC2, and VDC3 are respectively written are connected to the pair of bit lines. In addition, precharge voltages SAP1, SAP2, and SAP3 of Vcc, ⅔ Vcc, and ⅓ Vcc generated by a power supply circuit (not shown) are applied to the sense amplifiers S/A1, S/A2, and S/A3, respectively. These precharge voltages SAP1, SAP2, and SAP3 are applied from the power supply circuit (not shown) in data write access.

The sense amplifiers S/A1, S/A2, and SA3 compare the reference levels VDC1, VDC2, and VDC3 written in the dummy cells DC1, DC2, and DC3 with the level of data of the bit line read from the memory cell 11A to amplify the data to "1" or "0" level. Data RD1, RD2, RD3, $\overline{RD1}$, $\overline{RD2}$, and $\overline{RD3}$ which are amplified to "1" or "0" are input to the data converter 16 and decomposed into 2 bits.

This data converter 16 is constituted by a logic circuit according to a read data conversion table shown in FIG. 4A and a write data conversion table shown in FIG. 4B. This logic circuit can be arranged according to a well-known technique.

The read data conversion table shown in FIG. 4A shows a manner wherein the multi-level data RD1, RD2, and RD3 output from the sense amplifiers S/A1, S/A2, and S/A3 are converted into 2-bit data. Therefore, the data RD1, RD2, and RD3 output from the sense amplifiers S/A1, S/A2, and S/A3 are decomposed into 2-bit data B1 and B2. The data B1, B2, ... are supplied to the input/output circuit 17.

The write data conversion table shown in FIG. 4B shows a manner wherein bit line connection signals RW1, RW2, and RW3 for connecting one of the sense amplifiers S/A1, S/A2, and S/A3 to a bit line are generated in accordance with the 2-bit data supplied from the input/output circuit 17. These bit line connection signals RW1, RW2, and RW3 are supplied to the switching circuits SW1, SW2, and SW3, respectively. Therefore, in data write access to the memory cell 11A, when the 2-bit data are supplied to the data converter 16 through the input/output circuit 17, one of the bit line connection signals RW1, RW2, and RW3 goes to high level in accordance with the write data conversion table. For example, when the bit line connection signal RW1 goes to high level, the switching circuit SW1 receiving it is turned on, such that the sense amplifier S/A1 is connected to the bit lines BL1 and $\overline{BL1}$. Since a voltage having a precharge level of Vcc is applied to the sense amplifier S/A1, a write potential of Vcc is applied to the bit lines BL1 and $\overline{BL1}$ to write this potential in the memory cell 11A.

An operation of the serial access memory will be described below with reference to timing charts shown in FIGS. 5 and 6.

Figure 5:
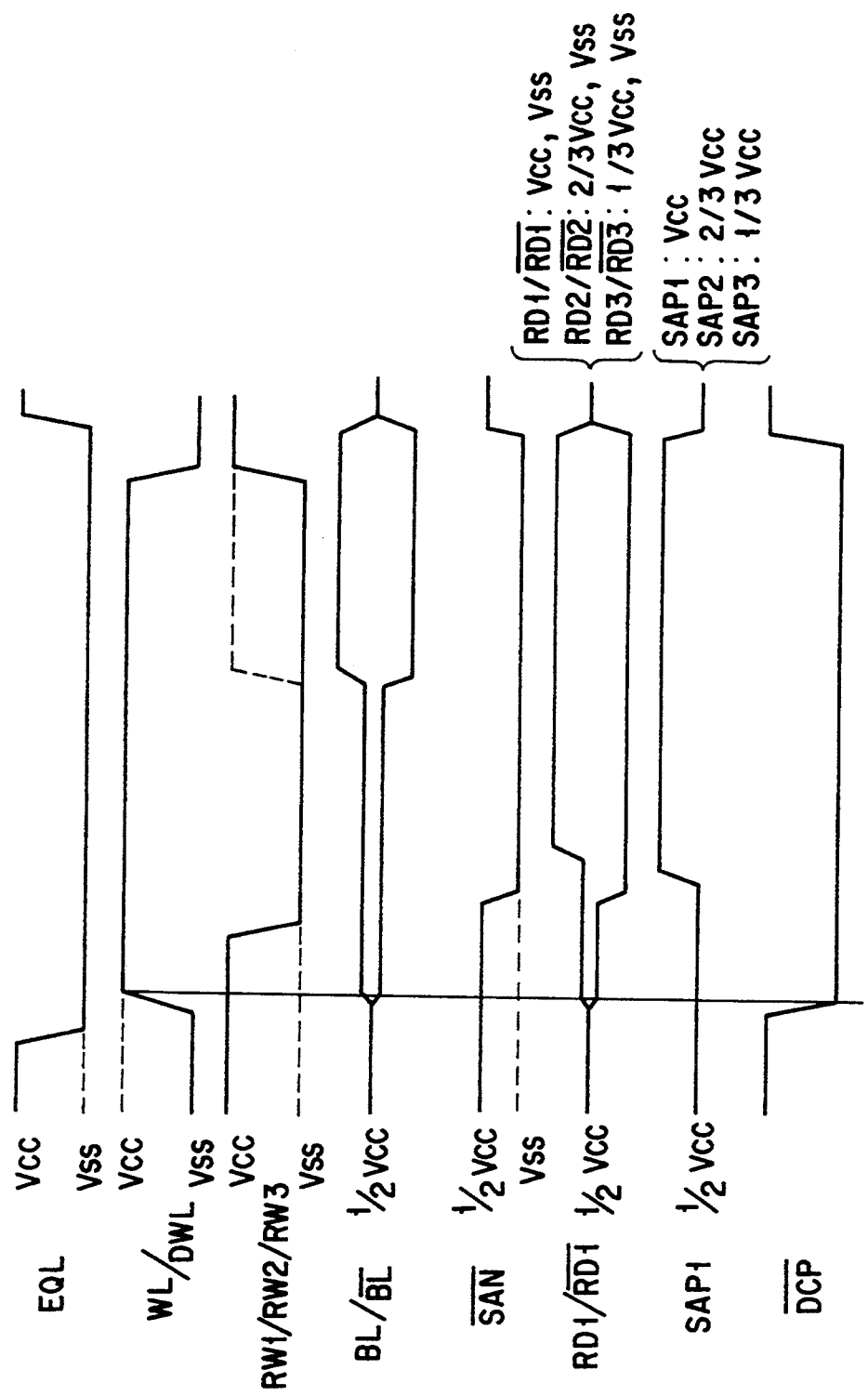
FIGS. 5 and 6 are timing charts for explaining an operation of FIGS. 2A, 2B, and 3.
Figure 6:
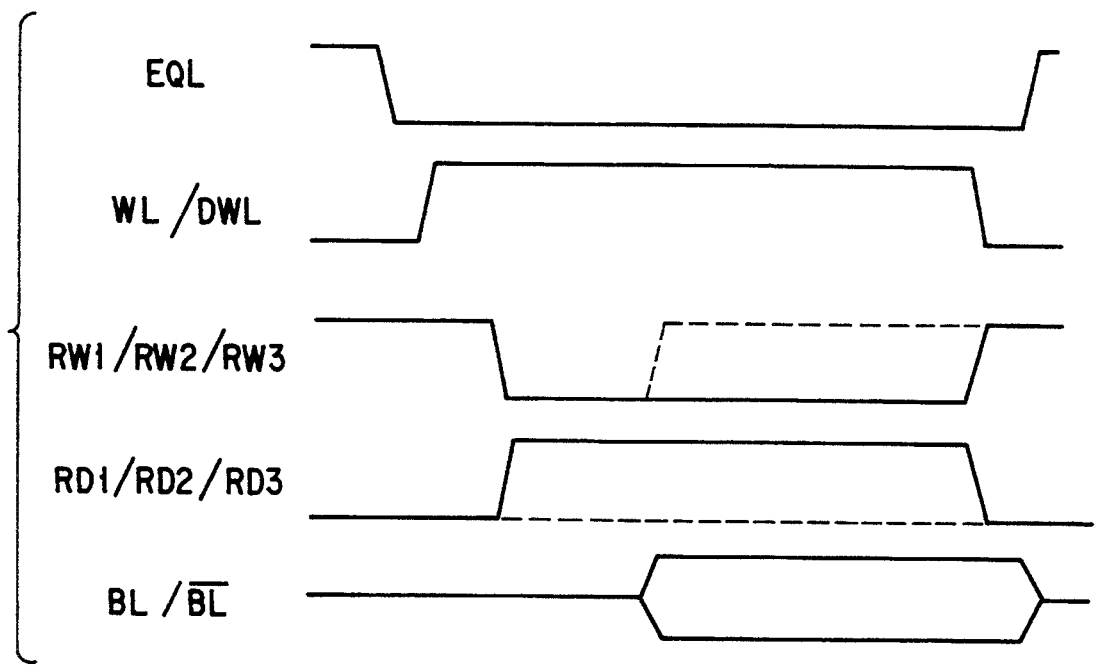

FIG. 5 shows reading and writing operations of data. In a precharging period, a bit line equalizing signal $\overline{EQC}$ is supplied to the equalizing circuit EQC, and the bit lines BL1 and $\overline{BL1}$ are short-circuited by the equalizing circuit EQC to be connected to the bit line potential $V_{BL}$ and set at about $\frac{1}{2}$-Vcc level.

When the memory is activated, the bit line equalizing signal EQL goes to low level, and one word line WL and one dummy word line DWL go to high level in response to an address signal. At this time, memory cell data are read on the bit lines BL and $\overline{BL1}$. Meanwhile, all the bit line connection signals RW1, RW2, and RW3 are set in an ON state, and the read data are transmitted to the three sense amplifiers S/A1, S/A2, and S/A3, respectively.

When the bit line connection signals RW1, RW2, and RW3 are turned off, the bit lines are separated from the sense amplifiers. Thereafter, a sense amplifier activating signal $\overline{SAN}$ goes to Vss level to activate the sense amplifiers. Before this processing, the reference levels VDC1, VDC2, and VDC3 are respectively written in the dummy cells DC1, DC2, and DC3 in response to a dummy cell write signal DCP. This dummy cell write signal DCP is turned off at the rise time of the word line. In the sense amplifiers S/A1, S/A2, and S/A3, the signal levels of the bit lines BL and $\overline{BL}$ are compared with the reference levels VDC1, VDC2, and VDC3 so as to be detected.

The precharge signals SAP1, SAP2, and SAP3 of the sense amplifiers go to high level, and the sense amplifiers are precharged. That is, the sense amplifiers S/A1, S/A2, and S/A3 are precharged to vcc level, $\frac{2}{3}$-vcc level, and $\frac{1}{3}$-Vcc level, respectively. Therefore, data RD1, RD2, and RD3 set at "1" or "0" level are respectively output from the sense amplifiers in accordance with the level of the precharge signal SAP and the reference levels. The data RD1, RD2, and RD3 are input to the data converter 16 and converted into 2-bit data to be supplied to the input/output circuit 17. Therefore, each time a word line is selected, 560-bit data are read in the input/output circuit 17. These data are serially output from the input/output circuit 17 in accordance with an instruction supplied from external equipment (not shown).

Thereafter, in accordance with the write conversion table of the data converter 16, one of the bit line connection signals RW1, RW2, and RW3 is turned on as indicated by a dotted line in FIG. 5 to rewrite data in bit lines. At this time, the two remaining bit line connection signals are turned on after the word line goes to high level. In addition, after the word line goes to low level, the bit line equalizing signal EQL is enabled again, and the bit lines BL and $\overline{BL}$ are precharged.

An writing operation of the memory will be described below with reference to FIG. 6.

When the memory starts a write operation, the bit line equalizing signal EQL is turned off, and the word line WL and the dummy word line DWL are turned off. In addition, all the bit line connection signals RW1, RW2, and RW3 output from the data converter 16 are disabled once.

Thereafter, in the data converter 16, one of the bit line connection signals RW1, RW2, and RW3 is enabled in accordance with write data supplied from the input/output circuit 17 according to the above conversion table. In this period, a sense amplifier activating signal SAN goes to Vss level, and the precharge level signals SAP1, SAP2, and SAP3 are set at Vcc level, $\frac{2}{3}$-Vcc level, and $\frac{1}{3}$-Vcc level, respectively. Therefore, the potential of a bit line in write access is set to be any one of vcc, $\frac{2}{3}$ vcc, $\frac{1}{3}$ vcc, and vss. As described above, when one of the bit line connection signals RW1, RW2, and RW3 is enabled to connect one sense amplifier to a bit line, data having the precharge level of the connected sense amplifier is transmitted to the bit line to be written in one memory cell in which the word line WL is ON.

According to the above embodiment, since data having two or more bits can be stored in one memory cell, the cost per bit can be decreased.

In addition, memory cells each of which can store data having 2 or more bits are used; the data are read out by three types of sense amplifiers having different reference levels; and the data are written in the memory cell by three types of power supply voltages. Therefore, bit line potentials can be easily controlled, and the arrangement of a data converter can be simplified.

Each time a word line is selected, 560-bit data can be simultaneously read out in the input/output circuit 17. Therefore, high-speed access can be performed. In addition, since the input/output circuit is constituted by a shift resister, serial access can be easily performed.

The check bit array 12 for detecting errors are added in correspondence with the data bit array 11, and 560-bit data read from the data bit array 11 and the check bit array 12 include check bits to be detected. For this reason, reliability of data can be assured, and a semiconductor memory according to the present invention can be used in place of a magnetic disk device.

In addition, a sense amplifier reads memory cell data and rewrites the read data in the corresponding memory cell in accordance with an instruction of the data converter 16.

Since the data bit array 11 and the check bit array 12 are arranged on one chip, a magnetic disk device can be easily replaced by a semiconductor memory of the present invention.

In the above embodiment, although 4-level data are applied to the present invention, 8-level or 16-level data may be applied to the present invention by increasing the number of sense amplifiers.

The number of data bits and the number of check bits are not limited to the above embodiment. That is, in the above embodiment, although each of the check and data bits has 4 levels, when the check bit has 4 or less levels, an influence of a software error can be weakened, thereby improving the reliability of the semiconductor memory.

In the above embodiment, although a dynamic memory cell constituted by one transistor and one capacitor is used as the memory cell 11A, the present invention is not limited to this dynamic memory cell, and for example, an EPROM (Erasable Programmable Read Only Memory) can be used.

Figure 7:
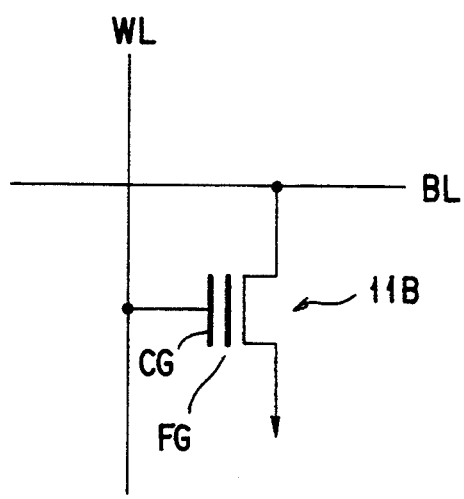
FIG. 7 is a circuit diagram showing a memory cell according to another embodiment of the present invention.

FIG. 7 shows a memory cell 11B using an EPROM having a floating gate FG and a control gate CG. When the memory cell 11B is used, two or more threshold values are set according to data to obtain the same effect as described in the above embodiment.

Figure 8:
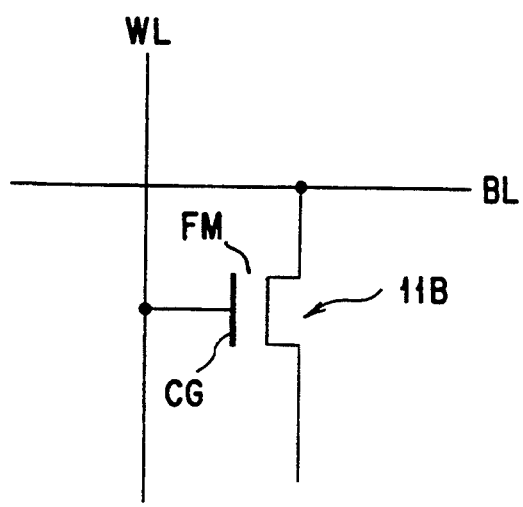
FIG. 8 is a circuit diagram showing a memory cell according to another embodiment of the present invention.

FIG. 8 shows a memory cell 11B using a ferroelectric material FM in place of the floating gate FG of the EPROM shown in FIG. 7.

What is claimed is:

1. A semiconductor memory comprising:
   a memory cell array including memory cells arranged in a matrix having row lines and column lines, each of the memory cells being connected to one of the row lines and one of the column lines, each of the memory cells storing a potential corresponding to multi-level data having at least two bits, wherein the memory cells connected to a selected row line simultaneously output the potentials to the corresponding column lines when the selected row line is selected;
   an amplifier circuit connected to the memory cell array, the amplifier circuit including a plurality of sense amplifiers, at least two of said sense amplifiers being connected in parallel to one of said column lines, the sense amplifiers detecting the potential read from the memory cells in accordance with different reference potentials supplied to respective sense amplifiers in data read access, each of the sense amplifiers supplied with one of a plurality of potentials corresponding to the multi-level data in data write access;
   a data converter connected to the amplifier circuit, the data converter converting potentials output from the amplifier circuit into data having a plurality of bits in data read access and selecting one of the sense amplifiers in accordance with write data having a plurality of bits in data write access, the selected sense amplifier supplying the potential to the respective column line; and
   an input/output circuit connected to the data converter, the input/output circuit serially outputting data supplied from the data converter in data read access and supplying external write data to the data converter in data write access.

2. An apparatus according to claim 1, wherein the input/output circuit comprises a shift register.

3. An apparatus according to claim 1, wherein the potentials in each memory cell are set at potentials which are in increments of $\frac{1}{3}$ of a power supply voltage.

4. An apparatus according to claim 1, wherein said amplifier circuit reads out memory cell data and rewrites the read data in a corresponding memory cell in accordance with an instruction of said data converter.

5. An apparatus according to claim 1, wherein the memory cell array comprises a first memory cell array for storing normal data and a second memory cell array for storing check data for detecting an error.

6. An apparatus according to claim 5, wherein the check data consist of multi-level data having a number of levels not more than that of the normal data.

7. An apparatus according to claim 5, wherein the first memory cell array is on a semiconductor substrate, and the memory cell array is on the semiconductor substrate.

8. A semiconductor memory comprising:
   a memory cell array including memory cells arranged in a matrix having row lines and column lines, each of the memory cells being connected to one of the row lines and one of the column lines, and each of the memory cells storing a potential corresponding to 4-level data, wherein the memory cells connected to a selected row line simultaneously output the potentials to the corresponding column lines when the selected row line is selected;
   an amplifier circuit connected to the memory cell array, the amplifier circuit including at least three sense amplifiers, each of the sense amplifiers being connected in parallel to one of the column lines, each of the sense amplifiers detecting the potential read from one of the memory cells in accordance with different reference potentials supplied to respective sense amplifiers in data read access, and each of the sense amplifiers supplied with one of the potentials corresponding to the 4-level data in data write access;
   a data converter connected to the amplifier circuit, the data converter converting potentials output from each of the sense amplifiers into data having a plurality of bits in data read access, and selecting one of the at least three sense amplifiers in accordance with write data having two bits in data write access, the selected sense amplifier supplying the potential to the respective column line; and
   an input/output circuit connected to the data converter, the input/output circuit serially outputting data supplied from the data converter in data read access and supplying external write data to the data converter in data write access.

9. An apparatus according to claim 8, wherein the input/output circuit comprises a shift register.

10. An apparatus according to claim 8, wherein the memory cell stores 2-bit data at four levels, and the amplifier circuit comprises three sense amplifiers having three different reference levels set for one column.

11. An apparatus according to claim 8, wherein the potentials in each memory cell are set at potentials which are in increments of $\frac{1}{3}$ of a power supply voltage.

12. An apparatus according to claim 8, wherein said amplifier circuit reads out memory cell data and rewrites the read data in a corresponding memory cell in accordance with an instruction of said data converter.

13. An apparatus according to claim 8, wherein the memory cell array comprises a first memory cell array for storing normal data and a second memory cell array for storing check data for detecting an error.

14. An apparatus according to claim 13 wherein the check data are constituted by multi-level data having the number of levels not more than that of the normal data.

15. An apparatus according to claim 13, wherein the first memory cell array is on a semiconductor substrate, and the second memory cell array is on the semiconductor substrate.

16. A semiconductor device comprising:

a first memory cell array including memory cells arranged in a matrix having row lines and column lines, each of the memory cells being connected to one of the row lines and one of the column lines, and each of the memory cells storing a potential corresponding to multi-level data having at least two bits;

a second memory cell array including memory cells arranged in a matrix form having the row lines and the column lines, each of the memory cells being connected to one of the row lines and one of the column lines, each of the memory cells storing a potential as check data corresponding to the multi-level data;

a row address decoder connected to the second memory cell array, the row address decoder selecting one of the row lines of the first and second memory cell arrays in accordance with address data;

an amplifier circuit connected to the first and second memory cell arrays, the amplifier circuit including a plurality of sense amplifiers., at least two of said sense amplifiers being connected in parallel to one of said column lines, the sense amplifiers detecting the potential read from the memory cells in accordance with different reference potentials supplied to respective sense amplifiers in data read access, each of the sense amplifiers supplied with one of the potentials corresponding to the multi-level data in data write access;

a data converter connected to the amplifier circuit, the data converter converting potentials output from the sense amplifiers into data having a plurality of bits in data read access and selecting one of the sense amplifiers in accordance with write data having a plurality of bits in data write access, the selected sense amplifier supplying the potential to the memory cell through the respective column line; and an input/output circuit connected to the data converter, the input/output circuit serially outputting data, including check data, supplied from the data converter in data read access and supplying external write data to the data converter in data write access;

wherein the first memory cell array is on a semiconductor substrate, and the second memory cell array is on the semiconductor substrate.

17. An apparatus according to claim 16, wherein the input/output circuit comprises a shift register.

18. An apparatus according to claim 16, wherein potentials in each memory cell are set at potentials which are in increments of $\frac{1}{3}$ of a power supply voltage.

19. An apparatus according to any one of claims 1, 8, and 16, wherein each of the memory cells comprises a dynamic cell having one transistor and one capacitor.

20. An apparatus according to any one of claims 1, 8, and 16, wherein each of the memory cells comprises an EPROM cell having a floating gate and a control gate.

21. An apparatus according to any one of claims 1, 8, and 16 wherein each of the memory cells comprises a floating gate and ferroelectric material.

22. A semiconductor memory device comprising:

a first memory cell array including memory cells arranged in a matrix having row lines and column lines, each of the memory cells being connected to one of the row lines and one of the column lines, each of the memory cells storing a potential corresponding to 4-level data having at least two bits;

a second memory cell array including memory cells arranged in a matrix having the row lines and the column lines, each of the memory cells being connected to one of the row lines and one of the column lines, each of the memory cells storing a potential as check data corresponding to the 4-level data;

a row address decoder connected to the second memory cell array, the row address decoder selecting one of the lines of the first and second memory cell arrays in accordance with address data;

an amplifier circuit connected to the first and second memory cell arrays, the amplifier circuit including at least three sense amplifiers, each of the sense amplifiers being connected in parallel to one of said column lines, each of the sense amplifiers detecting the level of the potential read from the memory cells in accordance with different reference potentials supplied to respective sense amplifiers in data read access, each of the sense amplifiers being supplied with one of a plurality of potentials corresponding to the 4-level data in data write access;

a data converter connected to the amplifier circuit, the data converter converting potentials output from the sense amplifiers into data having a plurality of bits in data read access and selecting one of the at least three sense amplifiers in accordance with write data having a plurality of bits in data write access, the selected sense amplifier supplying the potential to the memory cell through the respective column line; and an input/output circuit connected to the data converter, the input/output circuit serially outputting data including check data supplied from the data converter in data read access and supplying external write data to the data converter in data write access;

wherein the first memory cell array is on a semiconductor substrate, and the second memory cell array is on the semiconductor substrate.

* * * * *